United States Patent
Robinson

(10) Patent No.: US 6,838,353 B1
(45) Date of Patent: Jan. 4, 2005

(54) DEVICES HAVING IMPROVED CAPACITANCE AND METHODS OF THEIR FABRICATION

(75) Inventor: Karl M. Robinson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/246,918

(22) Filed: Feb. 9, 1999

Related U.S. Application Data

(62) Division of application No. 08/676,708, filed on Jul. 8, 1996, now Pat. No. 6,660,610.

(51) Int. Cl.[7] .......................................... H01L 21/8242
(52) U.S. Cl. .................... 438/396; 438/466; 438/768
(58) Field of Search ................................ 438/253, 396, 438/466, 768, FOR 220, FOR 430; 148/DIG. 13

(56) References Cited

U.S. PATENT DOCUMENTS

| | | | |
|---|---|---|---|
| 4,089,039 A | 5/1978 | Young | 361/322 |
| 4,200,474 A | 4/1980 | Morris | 148/1.5 |
| 4,243,494 A | 1/1981 | Riggs, Jr. et al. | 205/46 |
| 4,244,800 A | 1/1981 | Frazzini et al. | 204/195 R |
| 4,251,326 A * | 2/1981 | Arcidiacono et al. | 216/6 |
| 4,385,966 A | 5/1983 | Keller et al. | 204/15 |
| 4,450,048 A | 5/1984 | Gaulier | 204/15 |
| 4,458,295 A | 7/1984 | Durschlag et al. | 361/322 |
| 4,521,446 A | 6/1985 | Coleman, Jr. et al. | 427/86 |
| 4,665,608 A | 5/1987 | Okamoto et al. | 29/571 |
| 4,936,957 A | 6/1990 | Dickey et al. | 204/37.1 |
| 5,049,517 A | 9/1991 | Liu et al. | 437/52 |
| 5,053,351 A | 10/1991 | Fazan et al. | 437/52 |
| 5,061,650 A | 10/1991 | Dennison et al. | 437/47 |
| 5,068,199 A | 11/1991 | Sandhu | 437/52 |
| 5,082,797 A | 1/1992 | Chan et al. | 437/52 |
| 5,097,381 A | 3/1992 | Vo | 361/513 |
| 5,134,085 A | 7/1992 | Gilgen et al. | 437/52 |
| 5,168,073 A | 12/1992 | Gonzalez et al. | 437/47 |
| 5,185,075 A | 2/1993 | Rosenberg et al. | 205/234 |
| 5,189,503 A | 2/1993 | Suguro et al. | 257/310 |
| 5,192,703 A | 3/1993 | Lee et al. | 437/52 |
| 5,234,856 A | 8/1993 | Gonzalez | 437/47 |
| 5,354,705 A | 10/1994 | Mathews et al. | 437/52 |
| 5,372,962 A | 12/1994 | Hirota et al. | 437/47 |
| 5,381,302 A | 1/1995 | Sandhu et al. | 361/305 |
| 5,382,817 A * | 1/1995 | Kashihara et al. | 287/295 |
| 5,392,169 A | 2/1995 | Argyle et al. | 361/305 |
| 5,416,348 A | 5/1995 | Jeng | 257/297 |
| 5,438,011 A | 8/1995 | Blalock et al. | 437/52 |
| 5,463,483 A | 10/1995 | Yamazaki | 359/58 |
| 5,508,881 A | 4/1996 | Stevens | 361/305 |
| 5,563,089 A | 10/1996 | Jost et al. | 438/396 |
| 5,625,233 A | 4/1997 | Cabral, Jr. et al. | 257/771 |
| 5,685,968 A | 11/1997 | Hayakawa et al. | 205/122 |
| 5,696,394 A * | 12/1997 | Jones et al. | 257/295 |
| 5,708,302 A | 1/1998 | Azuma et al. | 257/751 |
| 5,739,565 A | 4/1998 | Nakamura et al. | 257/309 |
| 5,811,990 A | 9/1998 | Blodgett et al. | 326/81 |
| 5,876,788 A | 3/1999 | Bronner et al. | 427/81 |
| 5,893,731 A | 4/1999 | Lee et al. | 438/238 |
| 5,960,294 A | 9/1999 | Zahurak et al. | 438/398 |
| 6,025,257 A | 2/2000 | Jeon | 438/608 |
| 6,051,885 A | 4/2000 | Yoshida | 257/775 |
| 6,226,173 B1 | 5/2001 | Welsch et al. | 361/508 |
| 6,261,917 B1 * | 7/2001 | Quek et al. | 438/317 |
| 6,323,078 B1 * | 11/2001 | Bhowmik et al. | 257/296 |

FOREIGN PATENT DOCUMENTS

| | | | |
|---|---|---|---|
| JP | 2191330 | 7/1990 | H01L/21/8242 |
| JP | 04-044204 | 2/1992 | H01G/9/04 |
| JP | 05-121275 | 5/1993 | H01G/9/04 |
| JP | 7-226485 | 8/1995 | H01L/27/04 |

OTHER PUBLICATIONS

Genta, V., et al., "TiO2 Nonreflecting Films on Solar Cells", *Alta Frequenza*, 39 (6), 545–548, (Jun. 1970).

* cited by examiner

*Primary Examiner*—George Fourson
(74) *Attorney, Agent, or Firm*—Schwegman, Lundberg, Woessner & Kluth, P.A.

(57) ABSTRACT

A capacitor formed by a person using only two deposition steps and a dielectric formed by oxidizing a metal layer in an electrolytic solution. The capacitor has first and second conductive plates and a dielectric is formed from the first conductive plate.

28 Claims, 11 Drawing Sheets

US 6,838,353 B1

DEVICES HAVING IMPROVED CAPACITANCE AND METHODS OF THEIR FABRICATION

This is a divisional application of U.S. Ser. No. 08/676,708, filed Jul. 8, 1996 now U.S. Pat. No. 6,660,610.

BACKGROUND

Although there have been attempts to deposit metal oxides, such as TiO2 and SrTiO3, during semiconductor fabrication, thermal oxidation of metals in the fabrication of capacitors has been limited since an initial oxide layer prohibits further diffusion during thermal oxidation. As a result the use of high dielectric constant oxidized metals has been limited in semiconductor capacitor fabrication. One such metal, titanium dioxide, has a dielectric constant 2–15 times greater than present semiconductor capacitor dielectrics such as silicon nitride, while titanates are 2–1000 times greater.

In the January 1996 issue of Material Research Vol. 11, No. 1, an article entitled ELECTROCHEMICAL SYNTHESIS OF BARIUM TITANATE THIN FILMS, R. R. Bacsa et al. describes the synthesizing of polycrystalline films of barium titanate on titanium substrates by the galvanostatic anodization of titanium to form a material which has a dielectric constant of 200.

SUMMARY OF THE INVENTION

The invention include new capacitor structure and dielectrics and methods for forming such capacitors and dielectrics.

In one exemplary embodiment the capacitor of the invention is formed by a process using only two deposition steps. The capacitor has first and second conductive plates and a dielectric is formed from the first conductive plate.

In one exemplary process in accordance with the present invention a metal layer is deposited and at least partially oxidized in an electrolytic solution. The metal oxide formed during this oxidation forms the dielectric of the capacitor. Portions not oxidized may form at least a portion of a capacitor plate.

In one exemplary implementation in accordance with the present invention, a metal layer is deposited to overlie a first capacitor plate fabricated on a semiconductor wafer. The wafer is placed in an electrolyte conducive to forming an oxide with the metal. A potential is applied across the electrolyte and the metal, and at least a portion of the metal oxidizes. In a preferred embodiment the metal is titanium and titanium dioxide is formed during the electrochemical reaction. The capacitor fabrication is completed with the formation of a second capacitor plate overlying the oxidized metal layer. The oxidized metal layer functions as the dielectric of the capacitor and has a high dielectric constant.

DETAILED DESCRIPTION OF THE PREFERRED EMBODIMENTS

Figure 1:
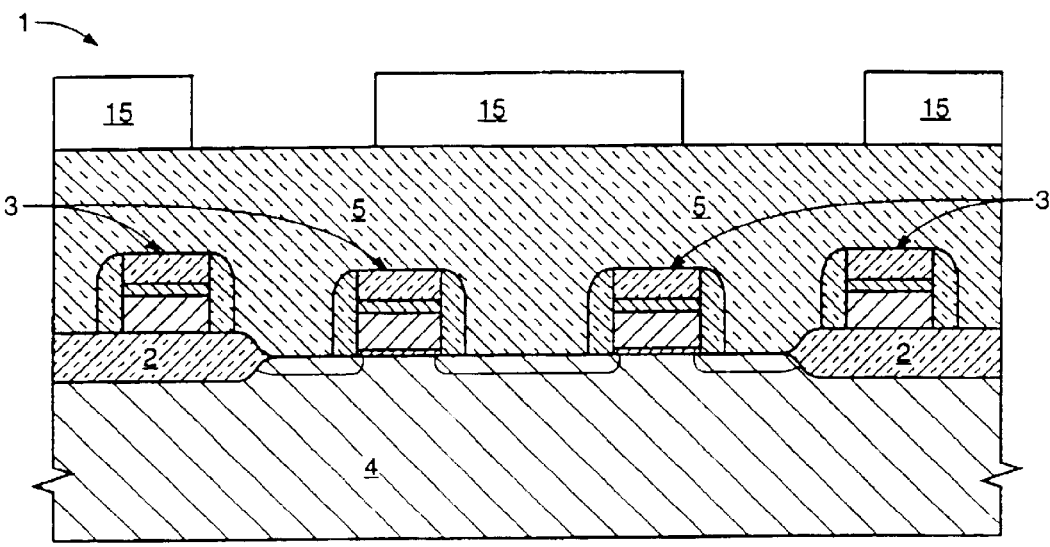
FIG. 1 is a cross section of a semiconductor wafer following the formation of a silicon dioxide layer and the masking thereof.

FIGS. 1–7 depict cross sectionally a semiconductor wafer 1 following the process steps of a first embodiment used in fabricating the wafer 1. In FIG. 1 field oxide regions 2 and wordlines 3 have been formed overlying a substrate 4 using conventional semiconductor process methods. Following the wordline formation a thick layer of silicon dioxide 5 is deposited to a thickness approximately equal to 5000 angstroms and then planarized. The silicon dioxide 5 is masked to define future capacitor substrate contact regions with mask layer 15.

Figure 2:
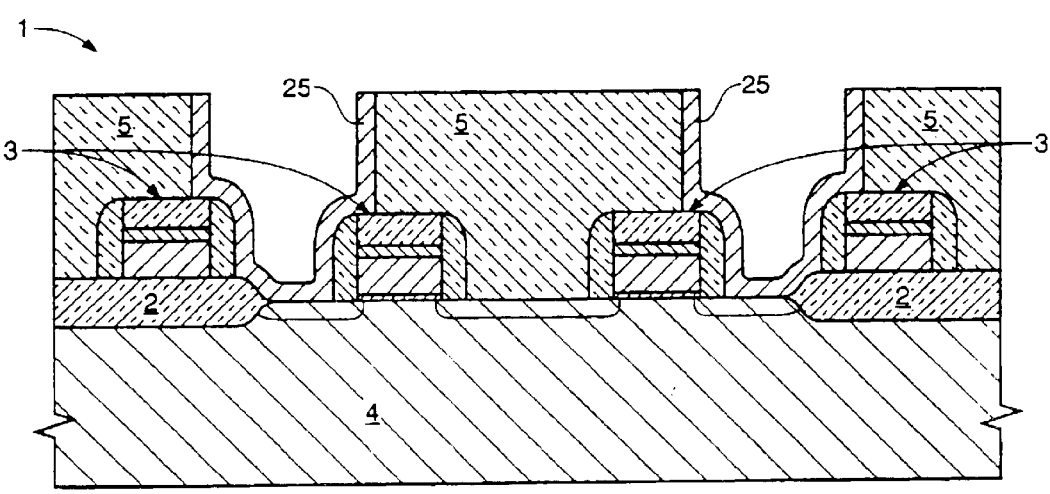
FIG. 2 is the cross section of FIG. 1 following an etch of the silicon dioxide layer and following a deposition and etch of polysilicon.

In FIG. 2 the silicon dioxide 5 is anisotropically dry etched to expose the substrate 4 in the unmasked regions. Following the etch a substantially conformal first conductive layer 25, preferably a polysilicon layer having a thickness of 200–400 angstroms, is deposited to overly the exposed substrate 4 and the silicon dioxide 5. Following the formation of the conductive layer 25 upper portions of the silicon dioxide layer 5 are exposed by removing portions of the conductive layer 25 using a spacer etch or using CMP (chemical mechanical planarization) following a resist deposit. The removal of portions of the conductive layer 25 creates electrically isolated portions of the conductive layer 25. The isolated portions of conductive layer 25 are first capacitor plates of the capacitor of the invention. Conventional methods for depositing the conductive layer 25 include CVD (chemical vapor deposition), PVD (pressure vapor deposition) and electroless deposition. In an alternate embodiment a metal layer is deposited by a conventional method and functions as the first conductive layer 25.

Figure 3:
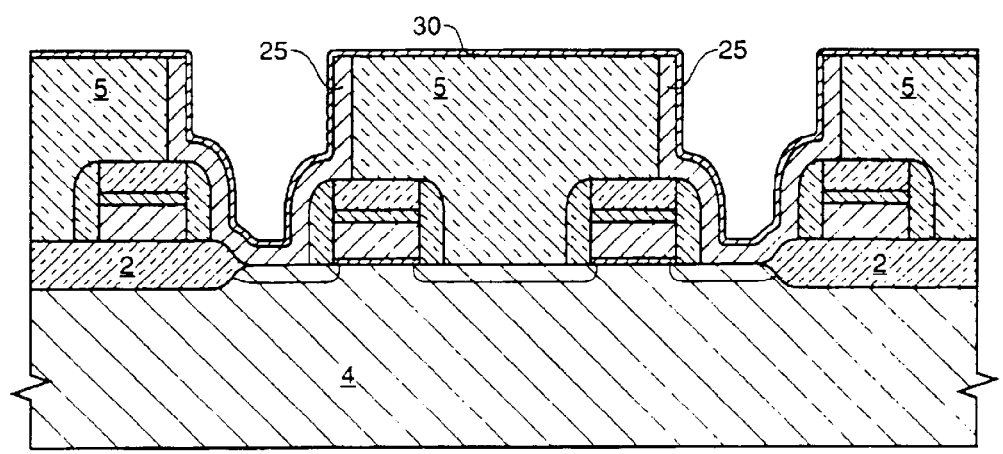
FIG. 3 is the cross section shown in FIG. 2 following a deposition of titanium.

Following the deposition and isolation of portions of the first conductive layer 25 a conformal metal layer 30 is deposited by chemical vapor deposition to overly the first conductive layer 25 and exposed portions of silicon dioxide layer 5, see FIG. 3. In a preferred embodiment the conformal metal layer 30 is titanium having a thickness of approximately 16–100 angstrom. Although in this embodiment titanium is preferred other metals may be used such as copper, gold, tungsten, and nickel. In a case where metal is used as the first conductive layer 25 it may be necessary to form diffusion barrier layer or an oxidation resistant layer or both interposed between the first conductive layer 25 and the metal layers 30. Thus, it should be noted that the first conductive layer 25 may actually be comprised of more than one material. For example in a ministack application a conductive plug and further conductive layers overlying the conductive plug may form the first conductive layer.

Figure 4:
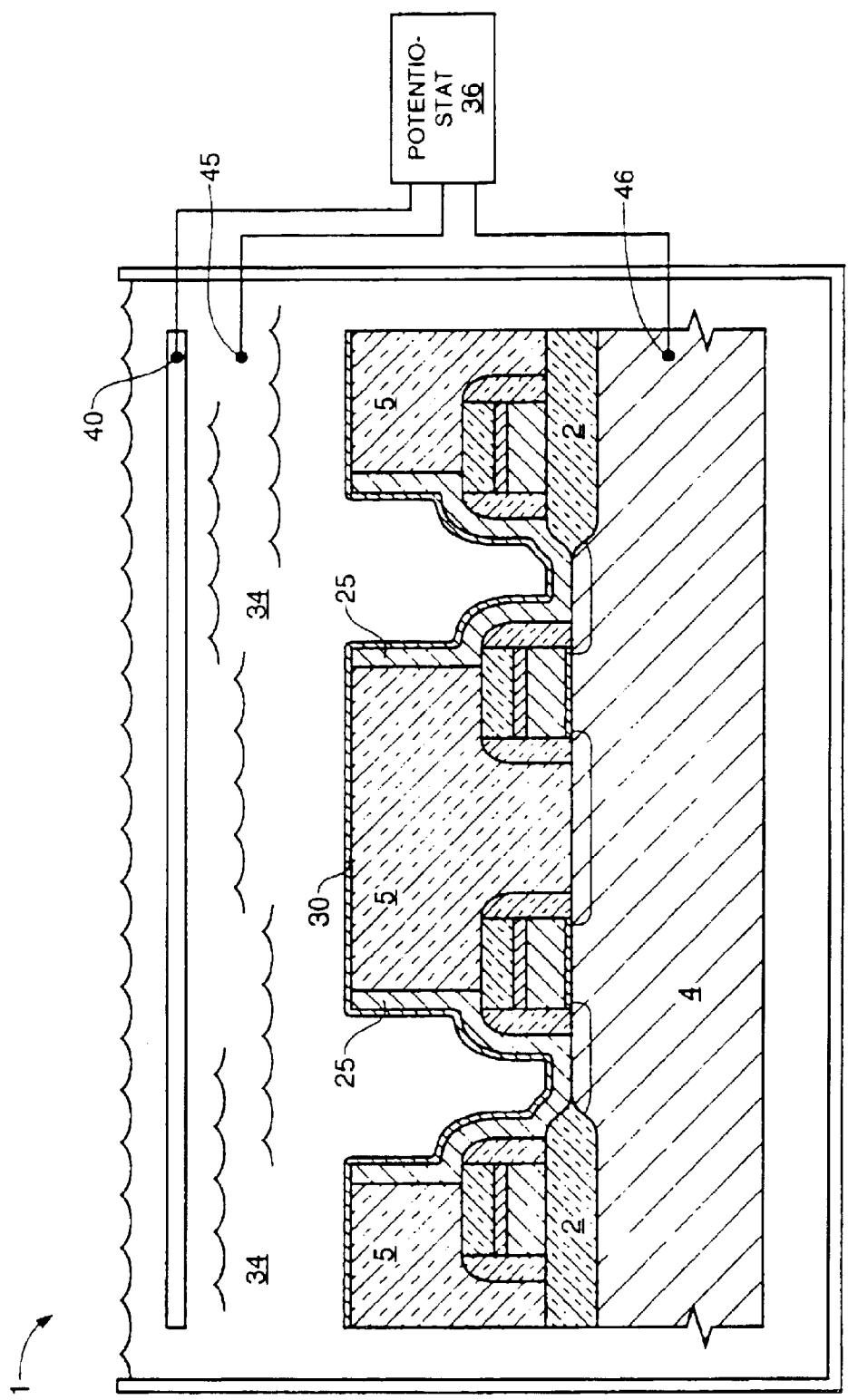
FIG. 4 is the cross section shown in FIG. 3 when placed in an apparatus configured to perform electrochemical oxidation.

In FIG. 4 the wafer 1 is placed in electrolytic solution 34 conducive to oxidizing the metal layer 30 when a potential is applied across the electrolytic solution 34 and the metal layer 30. The electrolytic solution 34 contacts the metal layer 30. In the preferred embodiment the electrolytic solution 34 is water, such as one part NH4OH for 10 parts water or 0.1 Mole HCLO4. However, a basic or acidic solution could also be used. A potentiostat 36 consists of a first electrode 40, known as a counter electrode, and a second electrode 45, known as a reference electrode. Both the first 40 and second 45 electrodes are emersed in the electrolytic solution 34. The potentiostat 36 also provides a third electrode 46, known as the working electrode, which is connected to the substrate 4. The substrate 4 is in electrical communication with the metal layer 30. The potentiostat 36 is a standard device, one of which is a PAR available from E.G. & G. of Princeton, N.J. The preferred reference electrode is an SCE (saturated calomel electrode). The potentiostat 36 monitors the current flowing between the first and third electrodes 40 and 46. The potentiostat controls the potential between the second and third electrodes 45 and 46. Preferably, the potential is in the range of –2.0 volts to 5 volts (i.e. SCE reference electrode) for 5–120 see depending on the desired thickness of the dielectric. The current is measured between electrodes 40 and 46 and is controlled by varying the potential between the second and third electrodes 45 and 46 to obtain the desired current. The potentiostat allows the potential to be adjusted within a range of potentials conducive to the oxidizing of titanium. The oxidation reaction simultaneously oxidizes the metal layer 30 across the entire wafer surface.

Although in the preferred embodiment a three electrode potentiostat controls the, electrochemical oxidation process, a two electrode rheostat control device may also be used. However, the oxidation is less controllable using the two electrode rheostat. When using the rheostat the second electrode 45 is eliminated and the electrochemical reaction changes the counter electrode chemistry. When this happens the potential changes. Thus the oxidation of the metal layer 30 is uncontrolled. In the three electrode preferred embodiment the existence of the reference electrode provides better control of the oxidation process.

Figure 5:
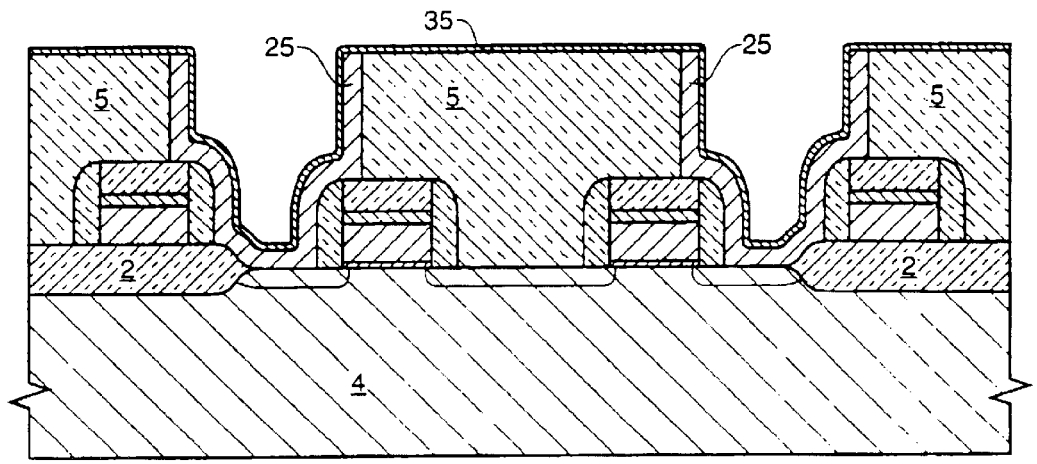
FIG. 5 is the cross section shown in FIG. 4 following the oxidation of the titanium layer.

In the first embodiment substantially all of the metal layer 30 is oxidized during the electrolytic process to form a metal oxide 35, titanium dioxide in the preferred embodiment, see FIG. 5. The titanium dioxide has a high dielectric constant. Preferably, the thickness of the metal oxide ranges between 10–1000 Angstroms and the dielectric constant is between 86 and 170.

Figure 6:
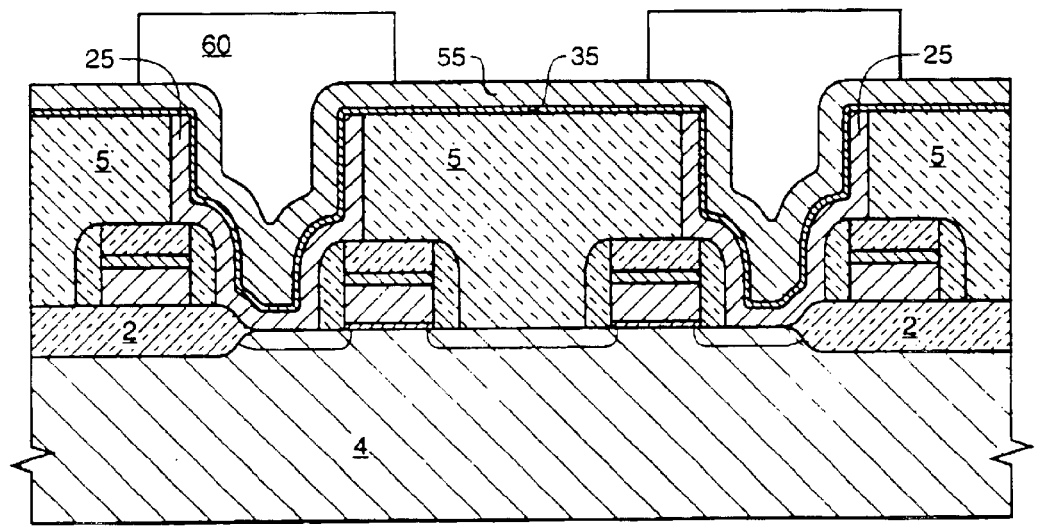
FIG. 6 is the cross section shown in FIG. 5 following the deposition and masking of a conductive layer.

Following the oxidation step the metal oxide is chemically mechanically planarized and a second conductive layer 55 is deposited to overlie the metal silicon dioxide layer 5, the silicon oxide 50 and the metal oxide 35, see FIG. 6. The second conductive layer 55 is created using conventional methods such as CVD, PVD, or electroless deposition. In the preferred embodiment the conductive layer 55 is polysilicon although metal may be used instead of polysilicon, and more than one material may be used to form conductive layer 55. A mask 60 is then formed to define the future capacitor structures.

Figure 7:
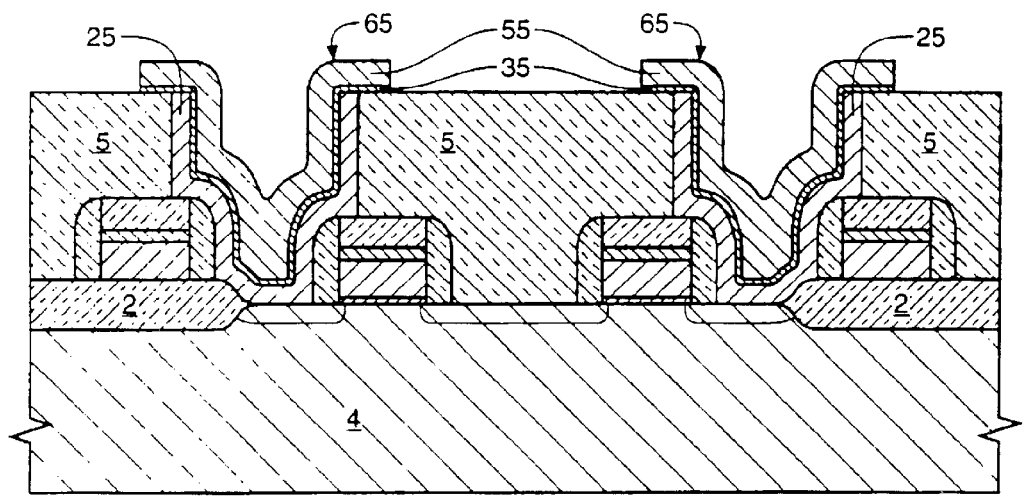
FIG. 7 is the cross section shown in FIG. 6 following the final capacitor formation.

In FIG. 7 the conductive layer 55 has been etched in unmasked regions to complete the capacitor structures 65. The capacitors 65 made by the method of the invention comprises a first capacitor plate which is first conductive layer 25, a second capacitor plate which is the second conductive layer 55, and a dielectric which is the metal oxide 35.

In an alternate embodiment it is only necessary to oxidize a portion of the metal layer 30 to create a metals metal oxide layer, or in the preferred embodiment a titanium/titanium dioxide layer. In this case the unoxidized metal layer 30 and the polysilicon layer 25 form the first capacitor plate while the thin layer of titanium oxide forms the dielectric.

In a still further alternate embodiment multiple layers of metal are deposited and at least a portion of each metal layer is electrochemically oxidized prior to the deposition of a subsequent metal layer. In this case the dielectric comprises alternate layers of oxide and metal. In this embodiment the second conductive layer 55 is deposited on the last metal oxide created.

In a second embodiment of the invention, shown in FIGS. 8A–12B, a first metal layer 75, such as titanium, is sputter deposited to overly the silicon dioxide layer 5 and to contact exposed portions of substrate 4 following the etch of the silicon dioxide layer 5 shown in FIG. 1. The wafer 1 is then placed in an electrolytic solution of acidic water. A current flows in the electrolytic solution in response to a potential applied across the electrolytic solution. The current is controlled with a potentiostat in order to control the oxidation of the metal layer. By controlling the oxidation it is possible to oxidize only a top portion of the first metal layer 75 to form a first metal oxide 80, see FIG. 9A.

Figure 8A:
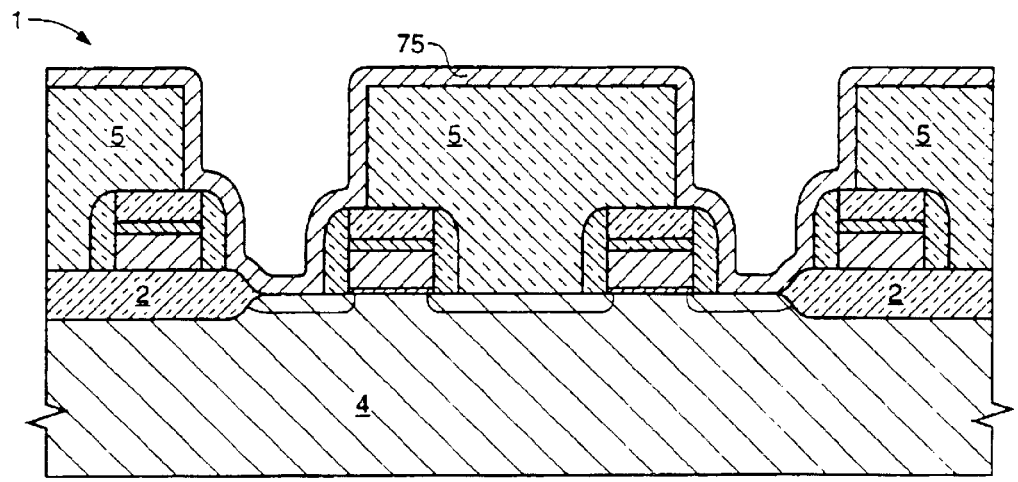
FIG. 8A is the cross section of the semiconductor wafer shown in FIG. 1 following an etch of the silicon dioxide layer and a deposit of a first metal layer.
Figure 8B:
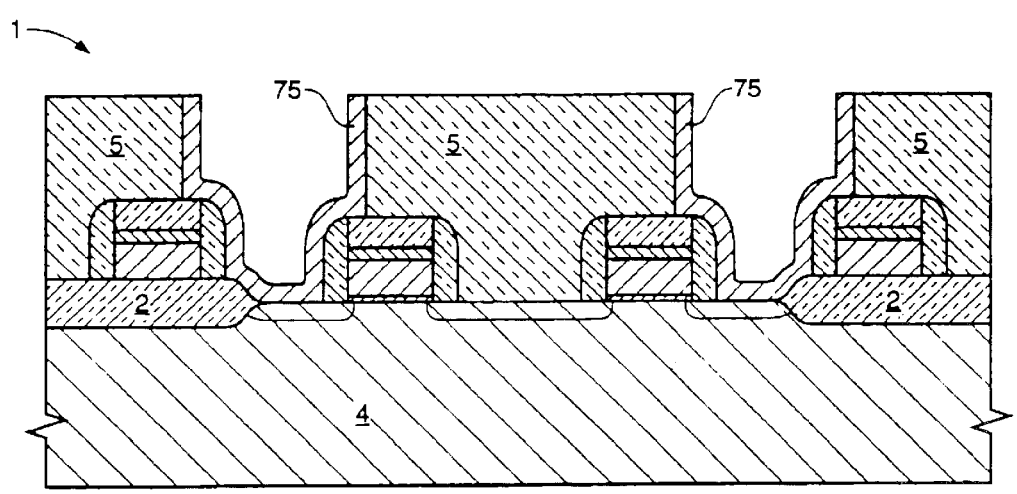
FIG. 8B is the cross section of the semiconductor wafer shown in FIG. 1 following an etch of the silicon dioxide layer and a deposit and planarization of a first metal layer.
Figure 9A:
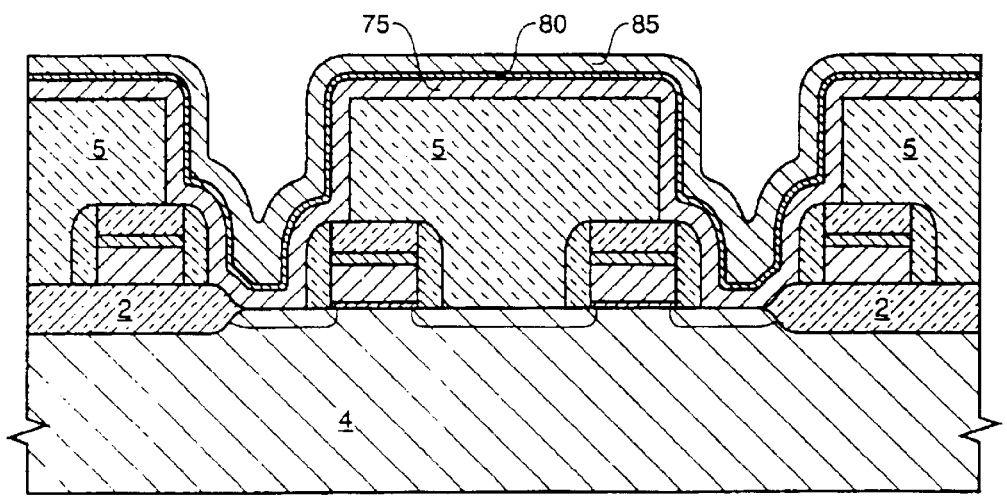
FIG. 9A is the cross section shown in FIG. 8A following the electrochemical oxidation of the first metal layer and a deposit of a second metal layer.
Figure 9B:
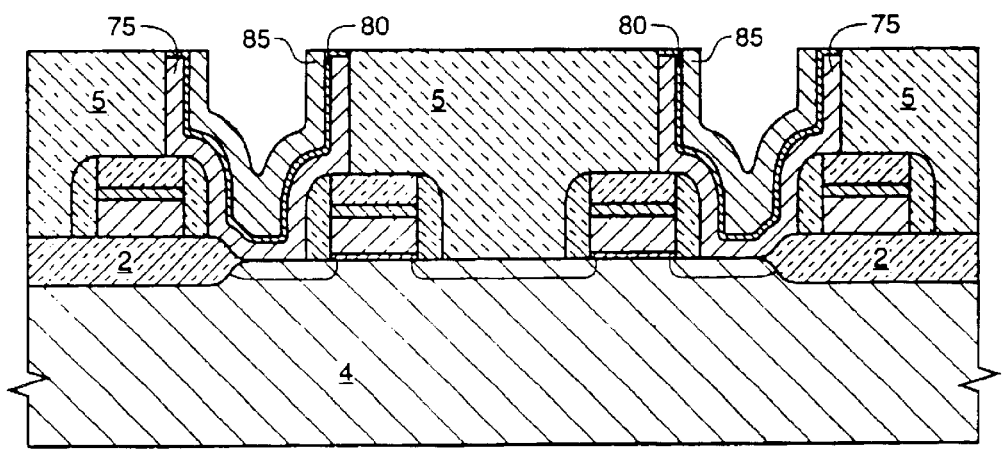
FIG. 9B is the cross section shown in FIG. 8B following the planarization and electrochemical oxidation of the first metal layer and following a deposit and planarization of a second metal layer.

Alternately the metal layer 75 is planarized to expose the silicon dioxide prior to oxidation and formation of the first metal oxide 80, see FIGS. 8B and 9B.

Following the first oxidation a second metal layer 85, FIG. 9A, is sputter deposited to overlie the first metal oxide 80. Again the wafer 1 is placed in the electrolytic solution and an upper portion of the second metal layer 85 is oxidized to form a second metal oxide 90, see FIGS. 10A and 10B.

Figure 10A:
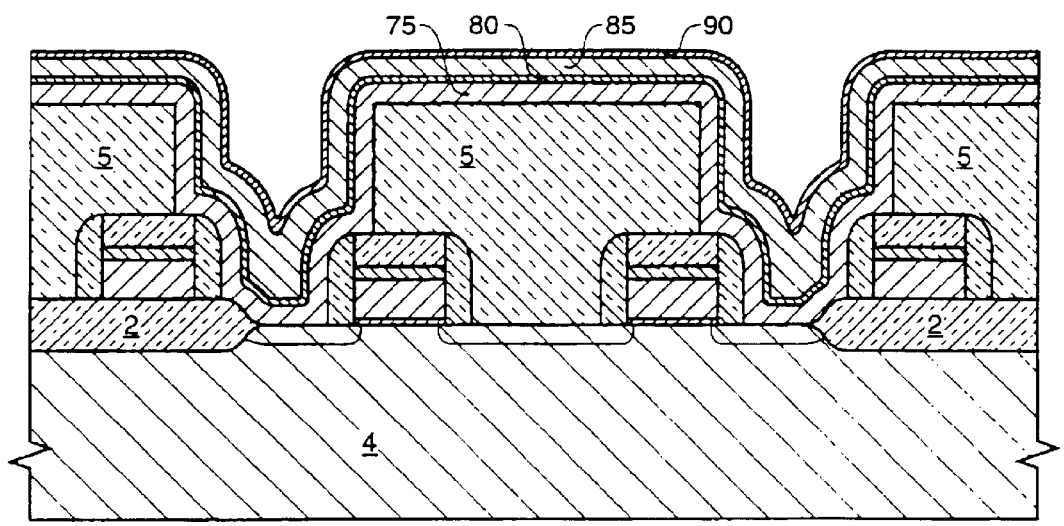
FIG. 10A is the cross section shown in FIG. 9A following an electrochemical oxidation of the second metal layer.
Figure 10B:
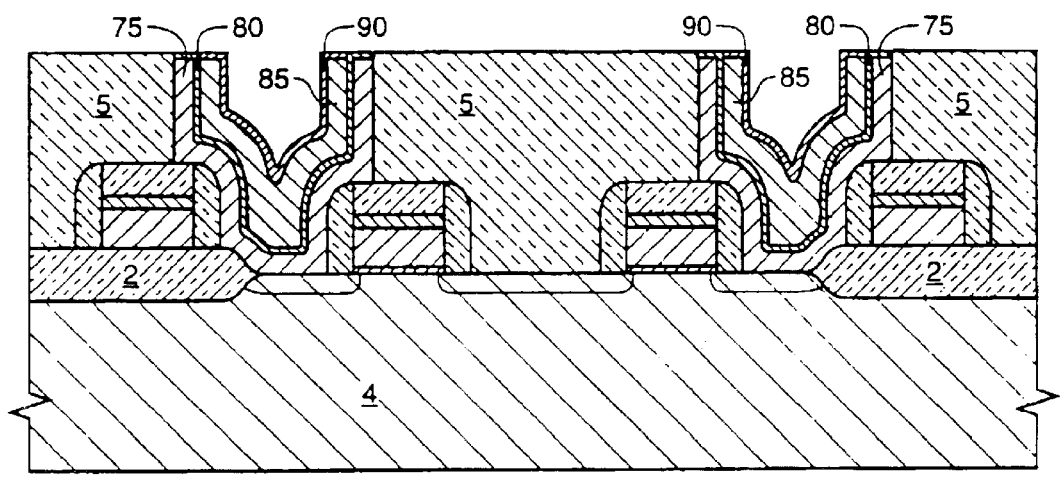
FIG. 10B is the cross section shown in FIG. 9B following a electrochemical oxidation of the second metal layer.

In the alternate embodiment, shown in FIGS. 9B and 10B, the second metal layer 85 has been planarized to expose the silicon dioxide prior to oxidation.

Figure 11A:
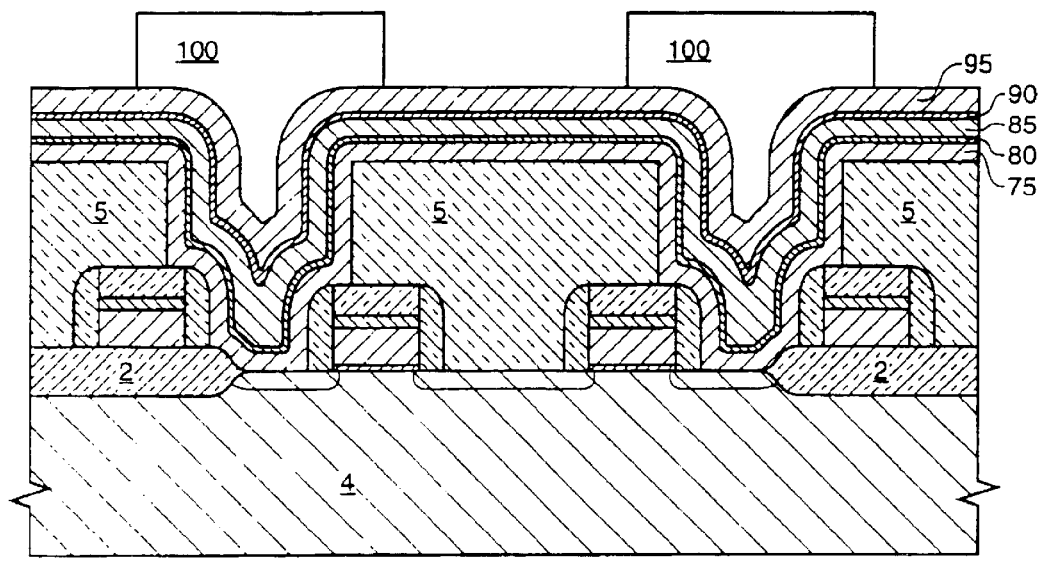
FIG. 11A is the cross section shown in FIG. 10A following the formation of a capacitor plate and the masking thereof.
Figure 11B:
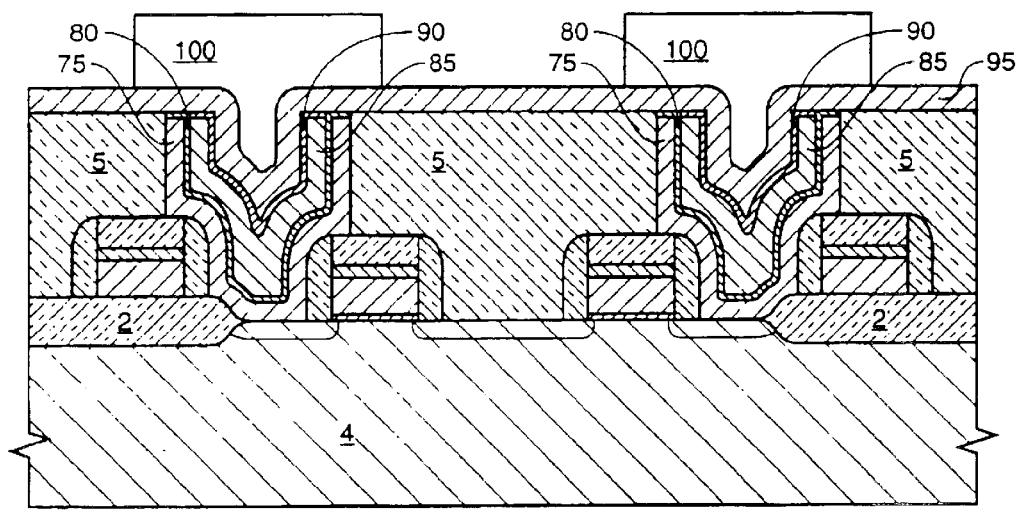
FIG. 11B is the cross section shown in FIG. 10B following the formation of a capacitor plate and the masking thereof

Following the oxidation of the second metal layer 85 a third metal layer 95 is sputter deposited to overly the second metal oxide layer 90, and capacitors are defined by a mask 100, see FIGS. 11A and 11B.

Figure 12A:
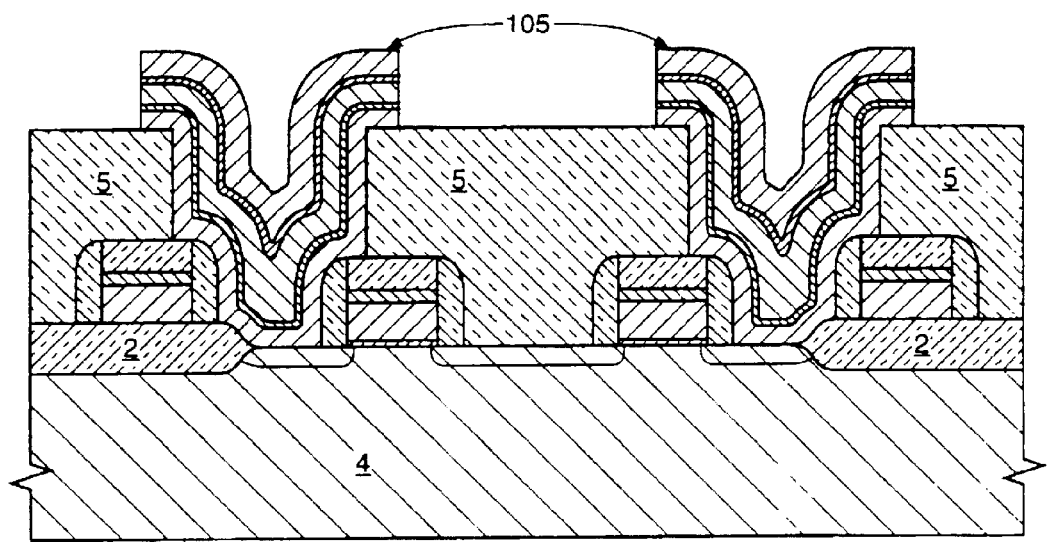
FIG. 12A is the cross section shown in FIG. 11A following an etch and showing one capacitor of the invention.
Figure 12B:
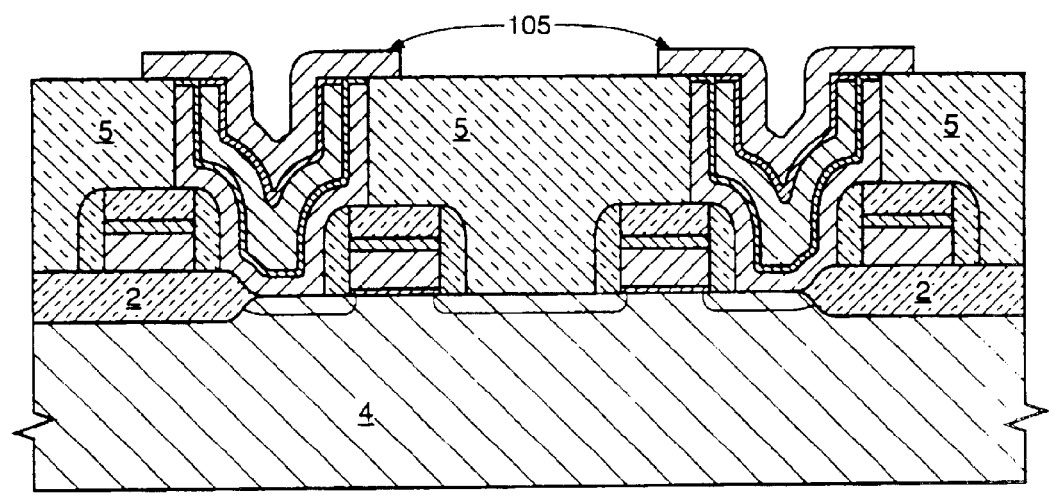
FIG. 12B is the cross section shown in FIG. 11B following an etch and showing one capacitor of the invention.

Exposed fit second and third metal layers 75, 85, and 95 and exposed first and second metal oxide layers 80 and 90 are etched to form the capacitors 105 of the invention, see FIGS. 12A and 12B. First and third metal layers 75 and 95 form first and second capacitor plates of the capacitors 105, and the first and second metal oxide layers 80 and 90 and second metal layer 85 form the dielectric of the capacitors 105. In a preferred embodiment the firsts second, and third metal layers 75, 85, and 95 are titanium. Therefore in the preferred embodiment the metal oxide layers 80 and 90 are titanium dioxide. It is also possible to use only one or to use more than the number of metal/metal oxide layers described above as the dielectric layer, or it is possible to oxidize an entire metal layer if it is not the first or last metal layer deposited.

In further conceived embodiments the metal layer 30 (in this embodiment titanium) may be alloyed with a material such as Strontium. In this case SrTiO3 is formed during the oxidation performed by the method of the invention. Other titanates may also be formed depending on the alloy used in combination with titanium. For Example, Ba or Pb may be combined with Ti to form BaTiO3 and PbTiO3, respectively, during oxidation. The process also works for $TiO3^{-2}$ complexes. In a still further embodiment the metal layer 30 (in this embodiment titanium) may be oxidized in a supersaturated $Sr^{+2}$ solution such as Sr(OH)2 to form SrTrO3, in a preferred embodiment.

Figure 13:
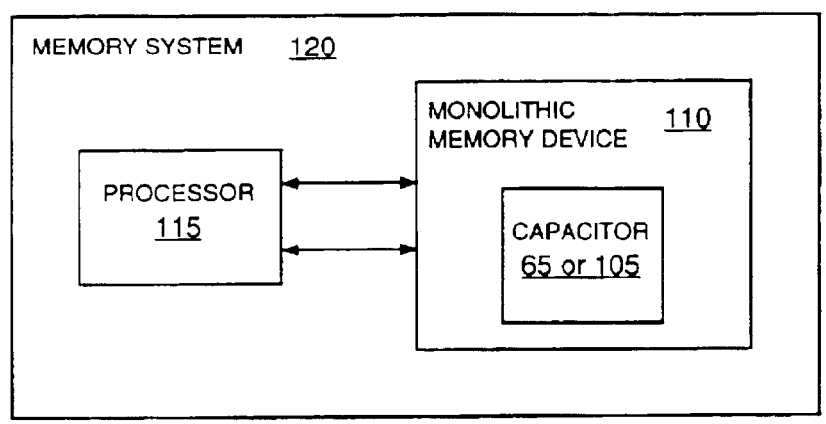
FIG. 13 is a block schematic of a memory system of the invention.

The capacitors 65 and 105 shown in FIGS. 7 and 12(A&B) respectively are typically used in a monolithic memory device 110, such as a dynamic random access memory device, as shown in FIG. 13. The monolithic memory device 101 and a processor 115 form part of a memory system 120. Me processor 115 is typically used to generate external control signals which accesses the monolithic memory device 110 either directly or through a memory controller.

It will be evident to one skilled in the art that many different combinations of materials, deposits and etch steps may be used to fabricate the capacitor and dielectric of the invention without departing from the spirit and scope of the invention as claimed the method for forming the dielectric of the invention is equally applicable to any type of capacitor structure, such as trench, container, and stacked and ministacked or variations thereof. The following patents: U.S. Pat. No. 5,438,011 (Blalock et al.), U.S. Pat. No. 5,097,381 (Vo), U.S. Pat. No. 5,155,057 (Dennison et al.), U.S. Pat. No. 5,321,649 (Lee et al.), U.S. Pat. No. 5,196,364 (Fazan et al.), U.S. Pat. No. 5,381,302 (Sandhu et al.), U.S. Pat. No. 5,392,189 (Fazan et al.), U.S. Pat. No. 5,082,797 (Chan et al.), U.S. Pat. No. 5,134,085 (Gilgen et al.), U.S. Pat. No. 5,354,705 (Mathews et al.), U.S. Pat. No. 5,049,517 (Liu et al.), U.S. Pat. No. 5,053,351 (Fazan et al.), U.S. Pat. No. 5,061,650 (Dennison et al.), U.S. Pat. No. 5,168,073 (Gonzalez et al.), U.S. Pat. No. 5,192,703 (Lee et al), U.S. Pat. No. 5,262,343 (Rhodes et al.), U.S. Pat. No. 5,234,856 (Gonzalez), and U.S. Pat. No. 5,416,348 (Jeng) pertaining to the fabrication of capacitors are herein incorporated by reference. Therefore the invention is only limited by the claims.

What is claimed is:

1. A method for forming a capacitor, comprising:
    forming on a substrate assembly a conductive layer of a first material, the conductive layer having portions electrically isolated from one another;
    forming a conformal metal layer of a second material atop the conductive layer wherein the first material is different from the second material; and
    forming a dielectric by electrically oxidizing at least a portion of the conformal metal layer
    forming a second metal layer over the dielectric; and
    oxidizing at least a portion of the second metal layer to form a second dielectric.

2. The method as specified in claim 1, further comprising forming a second conductive layer overlying the dielectric.

3. The method as specified in claim 2, wherein forming the conductive layer comprises depositing a material to form the conductive layer.

4. The method as specified in claim 1, further comprising forming the conformal metal layer from at least one of titanium, copper, gold, tungsten and nickel.

5. The method as specified in claim 1, further comprising applying a potential across an electrolytic solution and the conformal metal layer to oxidize said conformal metal layer.

6. A method for fabricating a capacitor on a wafer, comprising:
    forming a metal layer overlying a conductive layer of a starting substrate, the conductive layer having portions electrically isolated from one another and the metal layer having a material different from a material of the conductive layer;
    oxidizing the metal layer by applying a potential across an electrolytic solution and the metal layer thereby producing a metal oxide on the metal layer, the metal oxide constituting a capacitor dielectric, and an unoxidized portion of the metal layer and the conductive layer constituting a first capacitor plate;
    forming a second metal layer over the capacitor dielectric; and
    oxidizing at least a portion of the second metal layer to form a second capacitor dielectric.

7. A method of fabricating a capacitor on a wafer, comprising:
    forming a metal layer of a first material overlying a first conductive layer of a second material formed on a starting substrate, the first conductive layer having portions electrically isolated from one another, and the metal having a material different from a material of the first conductive layer;
    contacting the metal layer with an electrolytic solution;
    applying a potential across the electrolytic solution and the metal layer; and
    oxidizing at least a portion of the metal layer in response to said applying to form an oxidized layer, of metal oxide, the metal oxide constituting a capacitor dielectric, and an unoxidized portion of the conformal metal layer and the conductive layer constituting a first capacitor plate;
    forming a second metal layer over the capacitor dielectric; and
    oxidizing at least a portion of the second metal layer to form a second capacitor dielectric.

8. The method as specified in claim 7, wherein the first conductive layer includes polysilicon.

9. The method as specified in claim 7, further comprising forming a second conductive layer overlying the oxidized layer.

10. The method as specified in claim 7, wherein a non-oxidized portion of the metal layer and the first conductive layer form a conductive plate.

11. The method as specified in claim 7, wherein applying the potential further comprises:
    connecting a first electrode in contact with the electrolytic solution to a first terminal of a potential source; and
    connecting the starting substrate to a second terminal of the potential source.

12. The method as specified in claim 11, further comprising:
   positioning a second electrode to contact the electrolytic solution; and
   connecting the second electrode to the potential source.

13. The method as specified in claim 7, further comprising the step of adjusting the potential across the electrolytic solution to control the oxidation of the metal layer.

14. The method as specified in claim 13, further comprising:
   monitoring a current in the electrolytic solution; and
   adjusting the potential of the electrolytic solution to maintain a desired amount of the current.

15. A method for forming a capacitor, comprising:
   forming a first conductive layer of a first material, the first conductive layer having portions electrically isolated from one another;
   forming a metal layer of titanium overlying the first conductive layer, the metal layer having a material different from a material of the conductive layer;
   contacting the metal layer with an electrolytic solution;
   applying a potential across the electrolytic solution and the metal layer; and
   oxidizing at least a portion of the metal layer to form an oxidized layer of titanium-oxide in response to said applying, said oxidized layer forming at least a portion of a dielectric layer of the capacitor, and the first conductive layer forming a lower capacitor plate;
   forming a second metal layer over the oxidized layer; and
   oxidizing at least a portion of the second metal layer to form a second oxidized layer.

16. The method as specified in claim 15, further comprising forming a second electrically conductive layer overlying the dielectric layer to form an upper capacitor plate.

17. A method for forming a capacitor, comprising:
   forming a conductive layer of a first material in contact with a starting substrate, the conductive layer having portions electrically isolated from one another;
   forming a conformal metal layer of a second material overlying the conductive layer, the metal layer having a material different from a material of the conductive layer;
   contacting the metal conformal layer with an electrolytic solution;
   applying a potential across the electrolytic solution and the conformal metal layer;
   conducting current in the electrolytic solution in response to applying the potential;
   oxidizing a portion of the conformal metal layer in contact with the electrolytic solution, to form a metal oxide in response to said conducting current, the metal oxide constituting a capacitor dielectric, and an unoxidized portion of the conformal metal layer and the conductive layer constituting a first capacitor plate;
   forming a second metal layer over the metal oxide; and
   oxidizing at least a portion of the second metal layer to form a second metal oxide.

18. The method as specified in claim 17, further comprising:
   forming a second capacitor plate overlying the capacitor dielectric.

19. A method for forming a capacitor, comprising:
   forming a conductive layer of a first material in contact with a starting substrate, the conductive layer having portions electrically isolated from one another;
   forming a conformal metal layer of a second material overlying the conductive layer;
   contacting the metal conformal layer with an electrolytic solution;
   applying a potential across the electrolytic solution and the conformal metal layer;
   conducting current in the electrolytic solution in response to applying the potential;
   oxidizing a portion of the conformal metal layer to form a metal oxide in response to said conducting current, the metal oxide constituting a capacitor dielectric, and an unoxidized portion of the conformal metal layer and the conductive layer constituting a first capacitor plate, wherein the conformal metal layer is an initial metal layer and wherein the electrolytic solution is an initial electrolytic solution and wherein the metal oxide is an initial metal oxide, and further comprising:
   forming a further metal layer to overlying the initial metal oxide;
   contacting the further metal layer with a further electrolytic solution;
   applying a potential across the further electrolytic solution and the further metal layer;
   conducting current in the further electrolytic solution in response to said applying a potential across the further electrolytic solution; and
   oxidizing, in response to said step of conducting current in the further electrolytic solution, at least a portion of the further metal layer to form a further metal oxide, the further metal oxide forming a further portion of the capacitor dielectric.

20. The method as specified in claim 19, further comprising:
   forming a second capacitor plate overlying the capacitor dielectric.

21. The method as specified in claim 19, wherein the further electrolytic solution and the initial electrolytic solution are the same solution.

22. A method for forming a capacitor, comprising:
   forming an insulative layer overlying a substrate;
   masking the insulative layer to define a region in which to fabricate the capacitor;
   removing the insulative layer in an unmasked region to expose the substrate;
   depositing a polysilicon layer overlying the insulative layer and the substrate and contacting the substrate;
   removing portions of the polysilicon layer to expose the insulative layer;
   chemical vapor depositing a metal layer to overlie the polysilicon layer and the insulative layer;
   contacting the metal layer with an electrolytic solution;
   applying an electrical potential to the electrolytic solution and the metal layer, oxidizing, in response to said applying, at least a portion of the metal layer to form a metal oxide to function as a dielectric layer;
   forming a second metal layer over the metal oxide; and
   oxidizing at least a portion of the second metal layer to form a second metal oxide.

23. The method as specified in claim 22, further comprising:

forming a conductive layer overlying the metal oxide layer.

24. The method of claim 23, wherein the metal layer includes titanium.

25. The method as specified in claim 23, wherein the metal layer includes at least one of titanium, copper, gold, tungsten and nickel.

26. The method as specified in claim 25, wherein the conductive layer includes polysilicon.

27. A method of forming a capacitor, comprising:

forming a polysilicon layer overlying a substrate, the polysilicon layer having portions electrically isolated from one another;

forming a conformal metal layer atop the portions of the polysilicon layer;

electrolytically oxidizing at least a portion of the conformal metal layer to form an oxidized portion which serves as the capacitor dielectric;

covering the oxidized portion with a conductive layer;

electrolytically oxidizing at least a portion of the conductive layer to form a second dielectric oxidized portion; and covering the second dielectric with a second conductive layer.

28. The method as specified in claim 27, wherein forming the conformal metal layer includes depositing one of titanium, copper, gold, tungsten and nickel.

* * * * *